(12) United States Patent
David et al.

(10) Patent No.: US 6,878,419 B2
(45) Date of Patent: Apr. 12, 2005

(54) PLASMA TREATMENT OF POROUS MATERIALS

(75) Inventors: Moses Mekala David, Woodbury, MN (US); Brinda Balasubramaniam Lakshmi, Woodbury, MN (US)

(73) Assignee: 3M Innovative Properties Co., St. Paul, MN (US)

( * ) Notice: Subject to any disclaimer, the term of this patent is extended or adjusted under 35 U.S.C. 154(b) by 114 days.

(21) Appl. No.: 10/023,267

(22) Filed: Dec. 14, 2001

(65) Prior Publication Data

US 2003/0138619 A1 Jul. 24, 2003

(51) Int. Cl.⁷ .............................. H05H 1/46; C08J 7/18; B05D 3/06; C08F 2/52
(52) U.S. Cl. ...................... 427/535; 427/488; 427/489; 427/491; 427/536; 427/538; 427/539; 427/569; 427/577; 427/579
(58) Field of Search ................................ 427/488, 489, 427/490, 491, 535, 536, 538, 539, 569, 577, 578, 579

(56) References Cited

U.S. PATENT DOCUMENTS

| | | | |
|---|---|---|---|
| 3,632,494 A | 1/1972 | Herte et al. | |
| 4,438,154 A | 3/1984 | Kato et al. | |
| 4,643,876 A | 2/1987 | Jacobs et al. | |
| 4,749,588 A | 6/1988 | Fukuda et al. | |
| 4,760,005 A | 7/1988 | Pai | |
| 4,806,246 A | 2/1989 | Nomura | |
| 4,840,636 A | 6/1989 | Bauser et al. | |
| 4,869,922 A | 9/1989 | D'Angostino et al. | |
| 4,946,903 A | 8/1990 | Gardella et al. | |
| 4,968,918 A | 11/1990 | Kondo et al. | |
| 4,980,196 A | 12/1990 | Yasuda et al. | |
| 5,034,265 A | 7/1991 | Hoffman et al. | |
| 5,102,738 A | 4/1992 | Bell et al. | |
| 5,224,441 A | 7/1993 | Felts et al. | |
| 5,234,529 A | 8/1993 | Johnson | |
| 5,260,345 A | 11/1993 | DesMarais et al. | |
| 5,364,665 A | 11/1994 | Felts et al. | |
| 5,368,668 A | 11/1994 | Tochacek et al. | |
| 5,462,781 A | 10/1995 | Zukowski | |
| 5,486,357 A * | 1/1996 | Narayanan | 424/78.17 |
| 5,494,523 A | 2/1996 | Steger et al. | |
| 5,494,744 A * | 2/1996 | Everhart et al. | 427/542 |
| 5,679,264 A | 10/1997 | Gsell | |
| 5,783,641 A | 7/1998 | Koh et al. | |
| 5,871,811 A * | 2/1999 | Wang et al. | 427/248.1 |
| 5,888,594 A | 3/1999 | David et al. | |
| 5,948,166 A | 9/1999 | David et al. | |
| 5,980,814 A * | 11/1999 | Roller et al. | 427/314 |
| 6,015,597 A | 1/2000 | David | |
| 6,046,758 A | 4/2000 | Brown et al. | |
| 6,074,534 A | 6/2000 | Goudmand et al. | |
| 6,243,112 B1 * | 6/2001 | Kuhman et al. | 347/45 |
| 6,468,642 B1 * | 10/2002 | Bray et al. | 428/216 |

FOREIGN PATENT DOCUMENTS

| | | |
|---|---|---|
| DE | 41 22 834 A1 | 1/1993 |
| EP | 0 448 227 A1 | 9/1991 |
| EP | 0 710 739 A1 | 5/1996 |

(Continued)

OTHER PUBLICATIONS

Database WPI, Section Ch, Week 199210, Derwent Publications Ltd., London, GB; XP002238263 & JP 04 018922 A, Jan. 23, 1992, Abstract, to (n10d) nok corp.

(Continued)

Primary Examiner—Marianne Padgett
(74) Attorney, Agent, or Firm—Sean Edman

(57) ABSTRACT

The application discloses methods of plasma treatment that employ an ion sheath in a capacitively-coupled system to increase the hydrophilicity of porous articles, including microporous articles having pore sizes of 0.05 to 1.5 micrometers, both on their surfaces and in their pores such that the articles' bulk wetting properties are improved.

14 Claims, 6 Drawing Sheets

FOREIGN PATENT DOCUMENTS

| | | |
|---|---|---|
| EP | 0 805 476 A2 | 11/1997 |
| EP | 0 985 741 A1 | 3/2000 |
| JP | 6-184533 | 7/1994 |
| JP | 6-299146 | 10/1994 |
| JP | 2000-117880 | 4/2000 |
| JP | 2000-239963 | 9/2000 |
| WO | WO 96/27044 | 9/1996 |
| WO | WO 97/46484 | 12/1997 |
| WO | WO 99/05358 | 2/1999 |
| WO | WO 99/22635 | 5/1999 |
| WO | WO 99/28530 | 6/1999 |
| WO | WO 00/16913 | 3/2000 |
| WO | WO 00/16914 | 3/2000 |
| WO | WO 01/07144 A1 | 2/2001 |
| WO | WO 01/66820 A1 | 9/2001 |

OTHER PUBLICATIONS

Article: Tran et al., "Plasma Modification and Collagen Binding to PTFE Grafts," Journal of Colloid and Interface Science, vol. 132, Oct. 15, 1989, pp. 373–381.

Article: Yeh et al., "Blood Compatibility of Surfaces Modified by Plasma Polymerization," Journal of Biomedical Materials Research, vol. 22, No. 9, Sep., 1988, pp. 795–818.

Article: Iriyama et al., "Plasma Surface Treatment on Nylon Fabrics by Fluorocarbon Compounds," Journal of Applied Polymer Science, vol. 39, No. 2, Jan. 20, 1990, pp. 249–264.

Article: David et al., "Plasma Deposition and Etching of Diamond–Like Carbon Films," AICHE Journal, vol. 37, No. 3, Mar., 1991, pp. 367–376.

* cited by examiner

PLASMA TREATMENT OF POROUS MATERIALS

TECHNICAL FIELD

This invention relates to using a plasma treatment method to change the hydrophilicity of porous articles, and the resulting articles.

BACKGROUND

Porous articles have many uses. However, in some instances, a porous article does not have a hydrophilicity suitable for its desired use. For example, porous synthetic membranes desirable for filtering aqueous liquids are often hydrophobic.

The hydrophilicity of an article can be changed by chemical or physical reactions that coat the article with, or otherwise attach onto the article, a material having a hydrophilicity suitable for the article's intended use. But even when this type of treatment can be done, it can be difficult to effectively treat the pore interiors of the articles.

SUMMARY OF INVENTION

One aspect of the present invention features a plasma treatment method for changing the hydrophilicity of porous articles, both on the surface and in the pores such that the bulk wetting properties of the article are altered. It also features the resulting articles.

One aspect of the invention features a method of modifying the hydrophilicity of a porous article comprising: providing a reaction chamber having a capacitively-coupled system comprising at least one grounded electrode and at least one electrode powered by an RF source; generating a plasma in the chamber thereby causing an ion sheath to form around at least one of the electrodes; locating a porous article in the ion sheath; and allowing reactive species from the plasma to react with the article surface and pore interiors whereby the hydrophilicity of the article is changed such that the bulk wetting properties of the article are improved.

The treatment of the porous article may be continuous. In many cases, the article pore sizes are smaller than the mean free path of any species in the plasma. The ion sheath in which the article is placed is most often proximate the powered electrode. The porous articles may be foams, nonwoven materials, woven materials, membranes, frits, textiles, cloths, and microporous articles. The article may be treated on one or both sides, and may be post-treated with an oxygen plasma. Shadow masks may be used to create patterned or gradient treatment areas. The plasma may comprises materials such as carbon, hydrogen, silicon, nitrogen, sulfur, and oxygen. The reactor may comprise parallel plate electrodes or a drum electrode.

Another aspect of the invention features an article comprising a microporous membrane having a pore size with a lower limit of about 0.05 micrometers and an upper limit of about 1.5 micrometers, the membrane having on its surface and in its pores, a plasma-deposited composition that improves the bulk wetting properties of the article.

Other aspects of the invention include an article comprising (1) a porous article having two major surfaces wherein one major surface has a hydrophilic plasma-deposited composition that improves the bulk wetting properties of the article, and the other major surface is hydrophobic; and (2) a porous article having a patterned plasma-deposited composition.

As used in this invention:

"bulk wetting property" means the propensity of an article to absorb and soak up water;

"microporous membrane" means a membrane having pore sizes with a lower limit of about 0.05 $\mu$m and an upper limit of about 1.5 $\mu$m;

"plasma treatment" means thin film deposition, surface modification, and any other plasma-induced chemical or physical reaction that can change the hydrophilicity of an article; and "porous article" means an article having open tortuous pathways from its surface to its interior.

An advantage of at least one embodiment of the present invention is that it provides a continuous plasma treatment method, which allows for efficient processing of articles, especially continuous articles, e.g., long sheets of material.

Another advantage of at least one embodiment of the invention is that it provides a durable hydrophilic treatment through the bulk of porous articles, including microporous membranes.

Other features and advantages of the invention will be apparent from the following drawings, detailed description, and claims.

DETAILED DESCRIPTION

Figure 1:
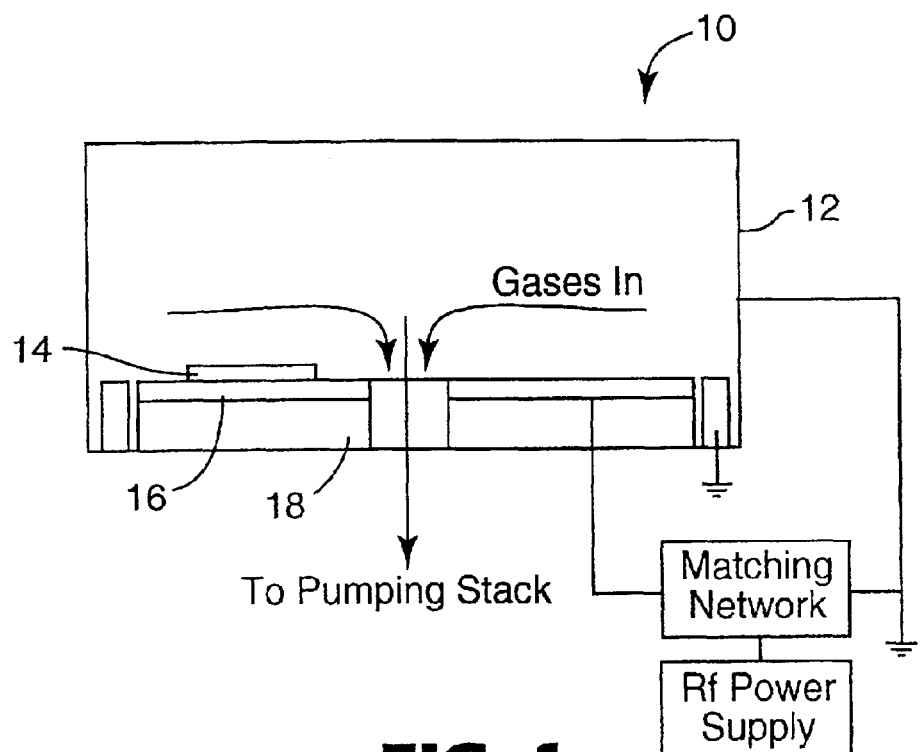
FIG. 1 depicts the cross-section of a cylindrical parallel plate plasma apparatus for performing the plasma-treatment of the present invention.

The present invention provides a plasma treatment method to modify the hydrophilicity of a porous article. The degree of hydrophilicity of the resulting article can range from strong to weak, depending on the type and amount of treatment.

The method involves providing a reaction chamber having a capacitively-coupled electrode system wherein an ion sheath is formed around at least one electrode when a plasma is generated in the system. The ion sheath is an area around an electrode in which ion bombardment is prevalent. The porous article to be treated is placed within the ion sheath.

The method of the invention is especially effective for articles with small pores because the ion sheath can force chemical species from the plasma into small pores of the articles being treated. This results in a change in the hydrophilicity of the pore interiors, which alters the bulk wetting properties of the article. It was not expected that plasma treatment could be achieved within small pores having tortuous paths, especially in cases where the pores are smaller than the mean free path of any species in the plasma.

The mean free path (MFP) for a particular species is the average distance traveled by a species before it collides with another species. The MFP depends in part on pressure because the proximity of species influences the collision frequency. For example, at 0.13 Pa (1 mTorr) and room temperature, the mean free path of an argon atom is 80 mm. Brian Chapman, *Glow Discharge Processes,* 153 (John Wiley & Sons, New York 1980. Most other gases, including those used in the present invention, are within three times (i.e. 26–240 mm) of this value at this pressure. In the range of pressures useful for plasma treatment, the mean free path of argon varies from 80 mm to 0.08 mm (or 80 microns) with changes in the pressure. Other gases would have similar variations.

In plasma-treating a porous article, if the pore size is smaller than the mean free path of the species in the plasma (i.e., smaller than about 20 microns), normally the free radical species generated in the plasma will collide with the pore walls near the pore opening. The free radicals will react with molecules in the pore walls near the pore opening rather than traveling into the depths of the pores. Therefore, one would not expect the plasma treatment to penetrate into the depths of the pores, especially when the pores have tortuous paths.

Porous Articles

Porous articles suitable for use in the present invention include foams, nonwoven materials, woven materials, membranes, frits, textiles, and microporous articles. These articles may have pore sizes of about 0.05 micrometers or greater. Particularly suitable articles are microporous films prepared by thermally-induced phase separation (TIPS) methods such as those described in U.S. Pat. No. 4,539,256 (Shipman), U.S. Pat. No. 4,726,989; U.S. Pat. No. 5,120,594 (Mrozinski); and U.S. Pat. No. 5,260,360 (Mrozinski et al.) which describe such films containing a multiplicity of spaced, randomly dispersed, equiaxed, nonuniform shaped particles of a thermoplastic polymer. These films typically have pore sizes with a lower limit of about 0.05 micrometers and an upper limit of about 1.5 micrometers.

Suitable polymers for the above articles include polyolefins such as, e.g., polypropylene, polyethylene, poly-(4-methyl-1-pentene), and combinations thereof, halogenated vinylpolymers (e.g., polyvinyl chloride), polystyrene, polycarbonates, polyesters, polyamides, and combinations thereof. The nonwovens can be formed by a variety of methods, including but not limited to, carding, use of a rando-webber, spunbonding, hydrolacing, or blown microfibers. The textiles and cloths can be formed as nonwovens or as knit or woven materials. The textiles and cloths preferably have a basis weight in the range of about 10 to 500 grams per square meter more preferably about 15 to 200 grams per square meter. Porous frits synthesized from polymers, metals, glasses and ceramics are available commercially in various pore sizes. The pore size typically varies between 1 and 250 microns and the frits may have a void volume of between 20 and 80%. Typical applications of frits include filtration, support media for membrane cartridges, solvent filters, diffusers, fluidization supports, bio-barriers, nibs for writing instruments, chromatographic support media, catalysis support media, etc.

The articles can be any shape, e.g., rods, cylinders, etc., as long as they can be placed within an ion sheath that surrounds an electrode. Typically the articles will be sheet-like with two major parallel surfaces. The articles may be discrete articles or may be continuous sheets of material. They may have any level of hydrophobicity or hydrophilicity before they are treated.

Apparatus

An apparatus suitable for the present invention provides a reaction chamber having a capacitively-coupled system with at least one electrode powered by an RF source and at least one grounded electrode.

A suitable reaction chamber is evacuable and is capable of maintaining conditions that produce plasma treatment. That is, the chamber provides an environment which allows for the control of, among other things, pressure, the flow of various inert and reactive gases, voltage supplied to the powered electrode, strength of the electric field across the ion sheath, formation of a plasma containing reactive species, intensity of ion bombardment, and rate of deposition of a film from the reactive species. Aluminum is a preferred chamber material because it has a low sputter yield, which means that very little contamination occurs from the chamber surfaces. However, other suitable materials, such as graphite, copper, glass or stainless steel, may be used.

The electrode system may be symmetric or asymmetric. For the present invention, asymmetric electrodes are preferable. Preferred electrode surface area ratios between grounded and powered electrodes for an asymmetric system are from 2:1 to 4:1, and more preferably from 3:1 to 4:1. The ion sheath on the smaller powered electrode will increase as the ratio increases, but beyond a ratio of 4:1 little additional benefit is achieved. It is generally preferred that the powered electrode be the smaller because DC bias on a smaller grounded electrode would be shunted to ground. The powered electrode may be cooled, e.g., with water.

Plasma, created from the gas within the chamber, is generated and sustained by supplying power (for example, from an RF generator operating at a frequency in the range of 0.001 to 100 MHz) to at least one electrode. The RF power source provides power at a typical frequency in the range of 0.01 to 50 MHz, preferably 13.56 MHz or any whole number (e.g., 1, 2, or 3) multiple thereof. The RF power source can be an RF generator such as a 13.56 MHz oscillator. To obtain efficient power coupling (i.e., wherein the reflected power is a small fraction of the incident power), the power source may be connected to the electrode via a network that acts to match the impedance of the power supply with that of the transmission line (which is usually 50 ohms reactive) so as to effectively transmit RF power through a coaxial transmission line. A description of such networks can be found in Brian Chapman, *Glow Discharge Processes,* 153 (John Wiley & Sons, New York 1980). One type of matching network, which includes two variable capacitors and an inductor, is available as Model # AMN 3000 from RF Power Products, Kresson, N.J. Traditional methods of power coupling involve the use of a blocking capacitor in the impedance matching network between the powered electrode and the power supply. This blocking capacitor prevents the DC bias voltage from being shunted out to the rest of the electrical circuitry. On the contrary, the DC bias voltage is shunted out in a grounded electrode. While the acceptable frequency range from the RF power source may be high enough to form a large negative DC self bias on the smaller electrode, it should not be so high that it creates standing waves in the resulting plasma, which is inefficient for plasma treatment.

The articles to be treated may be placed in, or passed through, the evacuable chamber. In some embodiments, a multiplicity of articles may be simultaneously exposed to the plasma during the process of this invention. For discrete planar articles, plasma treatment can be achieved, for example, by placing the articles in direct contact with the smaller electrode of an asymmetric configuration. This allows the article to act as an electrode due to capacitive coupling between the powered electrode and the article. This is described in M. M. David, et al., *Plasma Deposition and Etching of Diamond-Like Carbon Films,* AIChE Journal, vol. 37, No. 3, p. 367 (1991). In the case of an elongated article, the article is optionally pulled through the vacuum chamber continuously. The result is a continuous plasma treatment of the elongated article.

FIG. 1 illustrates a parallel plate apparatus 10 suitable for the present invention, showing a grounded chamber 12 from which air is removed by a pumping stack (not shown). Gases to form the plasma are injected radially inward through the reactor wall to an exit pumping port in the center of the chamber. Article 14 is positioned proximate RF-powered electrode 16. Electrode 16 is insulated from chamber 12 by Teflon support 18.

Figure 2:
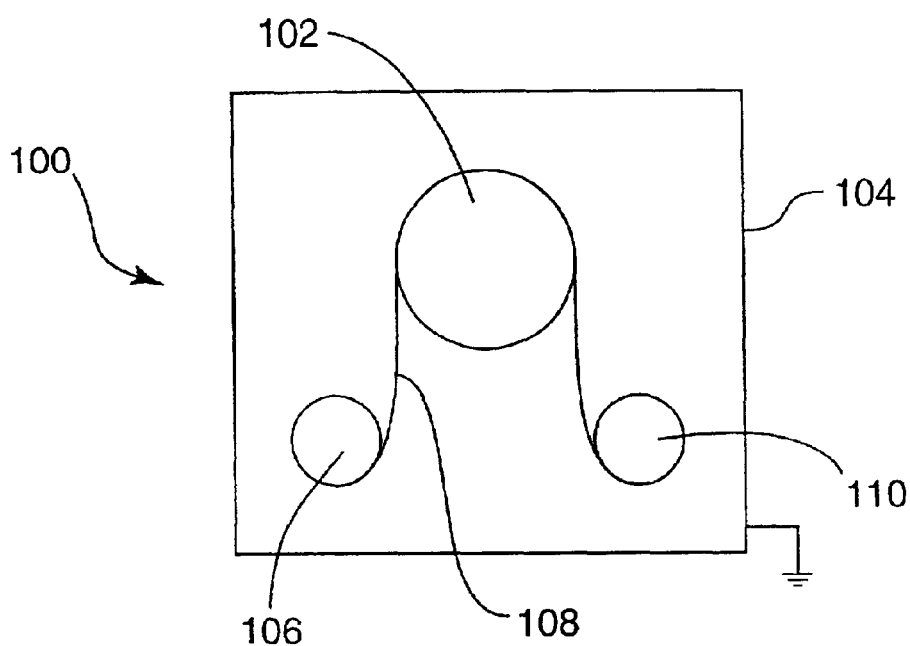
FIG. 2 depicts a single-drum apparatus for performing the plasma-treatment of the present invention.

FIG. 2 illustrates single-drum apparatus 100 suitable for the present invention. This apparatus is described in more detail in U.S. Pat. No. 5,948,166. The primary components of apparatus 100 are rotating drum electrode 102 that can be powered by a radio frequency (RF) power source, grounded chamber 104 that acts as a grounded electrode, feed reel 106 that continuously supplies article 108, which is to be treated, and a take-up reel 110, which collects the treated article.

Article 108 is a long sheet that, in operation, travels from feed reel 106, around drum electrode 102 and on to take-up reel 110. Reels 106 and 110 are optionally enclosed within chamber 104, or can be outside chamber 104 as long as a low-pressure plasma can be maintained within the chamber.

The curvature of the drum provides intimate contact between the article and the electrode, which ensures that the article remains within the ion sheath, irrespective of other operating conditions such as pressure. This can allow a thick article to be kept within the ion sheath even at high pressures (e.g., 40–133 Pa (300 to 1000 mTorr)). Because the article is supported and carried by the drum, this intimate contact also enables the treatment of delicate materials. The intimate contact also ensures that plasma treatment is captured by the article, thereby keeping the electrode clean. It also allows for effective single-sided treatment when this is desired. However, dual-sided treatment can be achieved by passing the article through the apparatus twice, with one side being treated per pass. A drum electrode also provides a long treatment zone (pixdiameter) and provides symmetric distribution of power across the electrode, which can have operational advantages. The drum may be cooled or heated to control the temperature of the article being treated. In addition, linear dimensions in the direction of current flow are made small in comparison to the wavelength of the RF radiation, eliminating the problem of standing waves.

In other suitable apparatuses, there may be more than one powered electrode and more than one grounded electrode. One suitable apparatus for this invention is a reactor comprising two drum shaped powered electrodes within a grounded reaction chamber, which has two to three times the surface area of the powered electrodes. The drums can be configured so that the article to be treated can travel around and over the two drums in a manner that allows it to be plasma-treated on both sides (one side is treated on each drum). The drums may be located in a single chamber or in separate chambers, or may be in the same chamber, but separated, such that different treatments can occur around each drum. For example, one drum may provide a treatment that employs carbon while the other provides a treatment that employs oxygen such that the two sides of the resulting article have different levels of hydrophilicity.

When multiple electrodes are used, they may be powered by a single RF supply or powered separately. When a single supply is used, the power is sometimes distributed unequally between the electrodes. This may be corrected by using a different power supply for each electrode with oscillator circuits linked to a master power supply through a phase angle adjuster. Thus any power coupling between the electrodes through the plasma may be fine-tuned by adjusting the phase angle between the voltage waveforms of the master and slave power supplies. Flexibility in power coupling and adjustment between the different electrodes may be achieved by this approach.

In addition to the capacitive coupling system, the reactor might include other magnetic or electric means such as induction coils, grid electrodes, etc.

Methods of Plasma Treatment

An aspect of the invention is further directed to a method of plasma-treating article. The method is carried out in a suitable capacitively-coupled reactor system such as those described above.

The article to be treated optionally may be pre-cleaned by methods known to the art to remove contaminants that may interfere with the plasma treatment. A useful pre-cleaning method is exposure to an oxygen plasma. For this pre-cleaning, pressures in the reactor are maintained between 1.3 Pa (10 mTorr) and 27 Pa (200 mTorr). Plasma is generated with RF power levels of between 500 W and 3000 W. Other gases may be used for pre-cleaning such as, for example, argon, air, nitrogen, hydrogen or ammonia, or mixtures thereof.

Prior to the plasma treatment process, the chamber is evacuated to the extent necessary to remove air and any impurities. This may be accomplished by vacuum pumps at a pumping stack connected to the chamber. Inert gases (such as argon) may be admitted into the chamber to alter pressure. Once the chamber is evacuated, a source gas containing the species to be deposited is admitted into the chamber via an inlet tube. The source gas is introduced into the chamber at a desired flow rate, which depends on the size of the reactor, the surface area of the electrodes, and the porosity of the article to be treated. Such flow rates must be sufficient to establish a suitable pressure at which to carry out plasma treatment, typically 0.13 Pa to 130 Pa (0.001 Torr to 1.0 Torr). For a cylindrical reactor that has an inner diameter of approximately 55 cm and a height of approximately 20 cm, the flow rates are typically from about 50 to about 500 standard cubic centimeters per minute (sccm). At the pressures and temperatures of the plasma treatment (typically 0.13 to 133 Pa (0.001 to 1.0 Torr) (all pressures stated herein are absolute pressures) and less than 50° C.), the source gases remain in their vapor form.

Upon application of an RF electric field to a powered electrode, a plasma is established. In an RF-generated plasma, energy is coupled into the plasma through electrons. The plasma acts as the charge carrier between the electrodes. The plasma can fill the entire reaction chamber and is typically visible as a colored cloud.

The plasma also forms an ion sheath proximate at least one electrode. In an asymmetric electrode configuration, higher self-bias voltage occurs across the smaller electrode. This bias is generally negative and in the range of 100 to 2000 volts. This biasing causes ions within the plasma to accelerate toward the electrode thereby forming an ion sheath. The ion sheath appears as a darker area around the electrode. Within the ion sheath accelerating ions bombard species being deposited from the plasma onto, and into the pores of, the article.

The depth of the ion sheath normally ranges from approximately 1 mm (or less) to 50 mm (or more) and depends on factors such as the type and concentration of gas used, pressure in the chamber, the spacing between the electrodes, and relative size of the electrodes. For example, reduced pressures will increase the size of the ion sheaths. When the electrodes are different sizes, a larger (i.e., stronger) ion sheath will form around the smaller electrode. Generally, the larger the difference in electrode size, the larger the difference in the size of the ion sheaths. Also, increasing the voltage across the ion sheath will increase ion bombardment energy.

The article is exposed to the reactive species within the ion sheath. The species within the plasma react on the article's surface and in its pores. Plasmas used to treat the porous articles contain species that, when deposited on the articles, can form compositions that change the hydrophilicity of the articles. A suitable plasma could contain two or more of oxygen, nitrogen, silicon, carbon, hydrogen, and sulfur in various combinations and ratios. The hydrophilicity of the final article may be controlled by a number of factors, for example, the components of the plasma, the length of treatment, and the partial pressure of the plasma components. The plasma treatment results in attachment of species to the article surface (including pore surfaces) via covalent bonds. The deposited hydrophilic composition may constitute a full layer over the entire exposed article surface (including pore surfaces), may be more sparsely distributed on the article, or deposited as a pattern through a shadow mask.

The plasma may also be used to deposit a reactive species that could later be reacted with a material having the desired hydrophilicity. For example, a porous article may be treated with a plasma containing silicon, oxygen, and hydrogen such that a diamond-like glass (DLG) is formed on and in the article. The article may then be subjected to an oxygen plasma, which will convert the methyl groups of the DLG to oxides, thereby making the article more hydrophilic than it would be with the DLG. DLG and its properties are described in U.S. Pat. No. 6,696,157, issued Feb. 24, 2004.

For treatments with carbon- or carbon-and-hydrogen-rich plasmas, hydrocarbons are particularly preferred as sources. Suitable hydrocarbon sources include acetylene, methane, butadiene, benzene, methylcyclopentadiene, pentadiene, styrene, naphthalene, and azulene. Mixtures of these hydrocarbons may also be used. Another source of hydrogen is molecular hydrogen ($H_2$). Sources of silicon include silanes such as $SiH_4$, $Si_2H_6$, tetramethylsilane, hexamethyldisiloxane, tetraethylorthosilicate (TEOS). Sources of oxygen include oxygen gas ($O_2$), hydrogen peroxide ($H_2O_2$), water ($H_2O$), nitrous oxide ($N_2O$), and ozone ($O_3$). Sources of nitrogen include nitrogen gas ($N_2$), ammonia ($NH_3$), and hydrazine ($N_2H_6$). Sources of sulfur include sulfur dioxide ($SO_2$), and hydrogen sulfide ($H_2S$).

Other sources of species for hydrophilizing plasma treatments include acrylic and methacrylic acid, acrylamides, methacrylamides, maleic and fumaric acid, vinyl ethers, pyrollidones, alcohols, glycols, etc. may be used to alter the hydrophilicity. The resulting deposits are highly crosslinked and commonly known as plasma polymers.

Other plasma treatments might include deposition of nitrides and oxides such as amorphous films of silicon nitride, silicon oxide, boron nitride, titania, aluminum nitride, aluminum oxide, etc, oxynitrides, etc. Furthermore, these might include the attachment of functional groups such as amine, hydroxyl, carboxyl, silanol, etc.

When treatment comprises deposition of a film, it typically occurs at rates ranging from about 1 to 100 nm/second (about 10 to 1000 Angstrom per second (A/sec)), depending on conditions including pressure, power, concentration of gas, types of gases, relative size of electrodes, etc. In general, deposition rates increase with increasing power, pressure, and concentration of gas, but the rates will approach an upper limit.

Figure 6A:
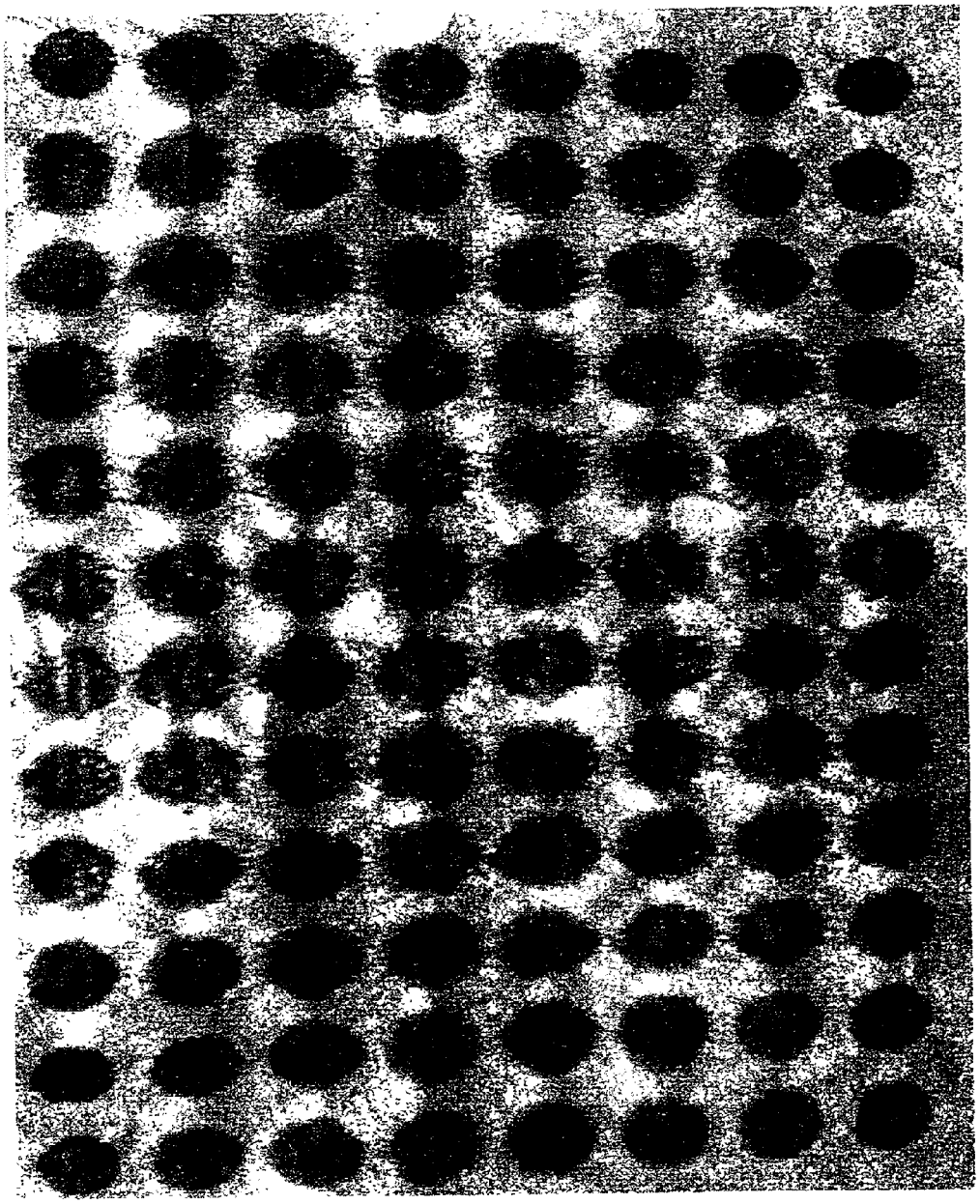
FIG. 6 is a digital image of a selectively treated porous article stained with the dye of (a) Sample 8A having treated regions with diameters of 0.75 cm and (b) Sample 8B having treated regions with diameters of 0.2 cm.
Figure 6B:
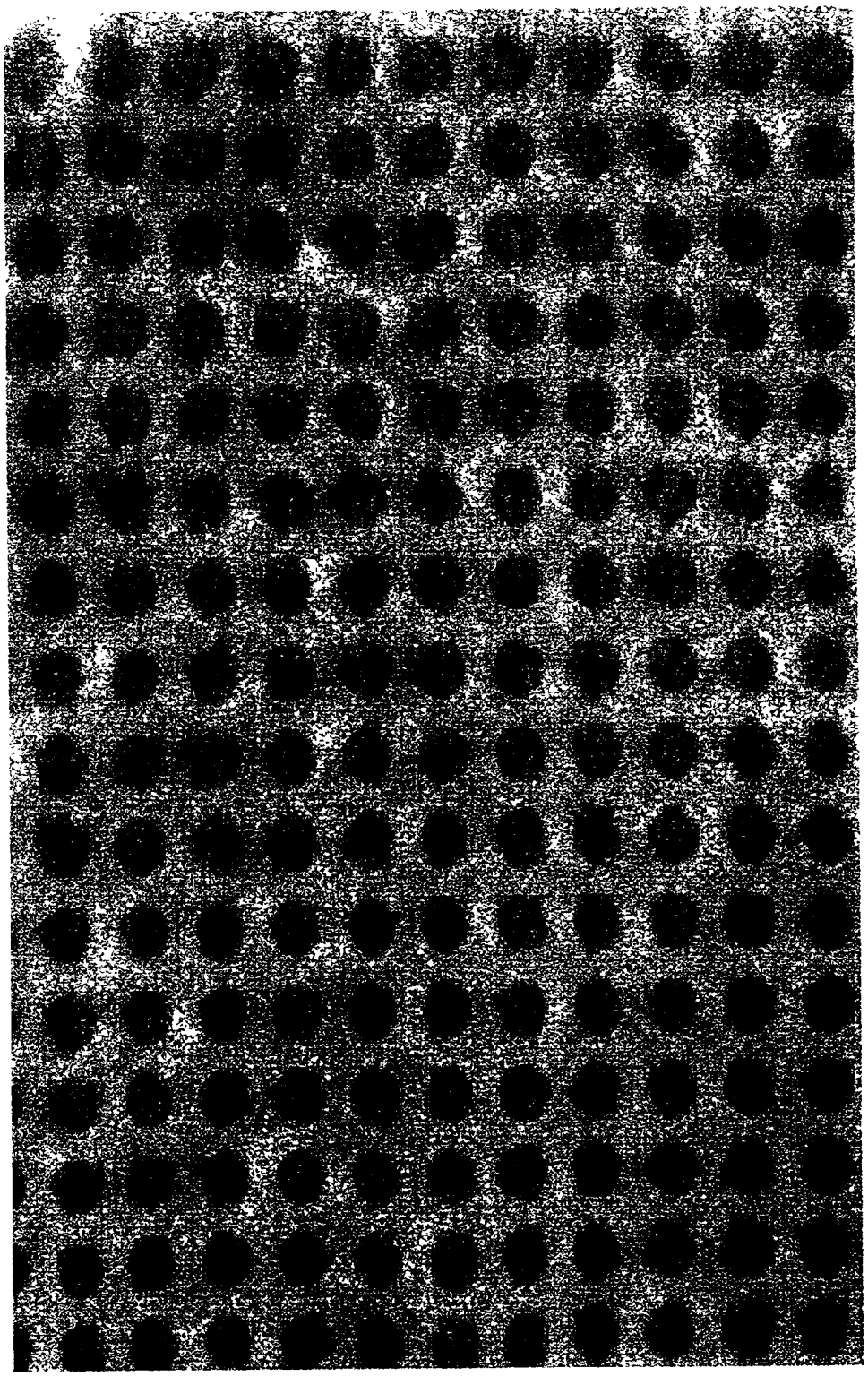

The articles also may be treated in a manner to provide different degrees of hydrophilicity in different areas of the article. This can be achieved, for example, by using contact masks to selectively expose portions of the porous article to the plasma treatment. The mask may be attached to the article or may be a separate web that moves with the article. By this method, it is possible to obtain hydrophilic areas on a hydrophobic article. The hydrophilic areas may be in any shape that can be achieved using a shadow mask, e.g., circles, stripes, squares, etc. FIGS. 6A and 6B are a digital image of the articles described in Example 8. The articles comprise polyethylene porous TIPS membranes on which diamond-like glass (DLG) was deposited through a contact mask having numerous circular holes. The methyl groups on the surface of the DLG were then converted to oxides by a post oxygen-plasma treatment to render the articles more hydrophilic. The articles were then stained with methylene blue, which was absorbed only by the hydrophilic sections of the articles.

Articles having hydrophilicity gradients may also be produced. This can be achieved by exposing different areas of an article to the plasma treatment for different lengths of time. If a hydrophobic article is treated, this could provide, for example, an article in which the hydrophilicity of an article changes gradually (or stepwise) from extreme hydrophilicity to extreme hydrophobicity.

Articles having patterned hydrophilic areas may be particularly useful for applications that require (1) keeping multiple aqueous samples separated, (2) high throughput assays for biotech applications (so many samples can be assayed at the same time without any cross-talk), and (3) bio chip applications.

In the foregoing description, certain terms have been used for brevity, clarity, and understanding. No unnecessary limitations are to be implied therefrom beyond the requirement of the prior art because such terms are used for descriptive purposes and are intended to be broadly construed. Moreover, the description and illustration of the invention is by way of example, and the scope of the invention is not limited to the exact details shown or described.

EXAMPLES

This invention may be illustrated by way of the following examples including the described test methods used to evaluate and characterize the plasma treated articles produced in the examples.

Test Methods

Contact Angle

The contact angle for water was measured on the surface of a porous sample with a Model No: DAT 1100 Fibrodat contact angle measurement instrument available from Thwing Albert Instrument Company. A sample was placed on one side of double-coated adhesive tape that was patterned with eight wells and affixed onto an eight-well sample holder. Drops of deionized water were observed under 30× magnification as they were deposited onto the sample over each well. The contact angles were monitored for 30 seconds and then recorded. The values reported are an average of three measurements, each from a different well.

Water Flow

Water flow was determined by measuring the time taken to pass a given amount of water through a treated porous sample having a thickness of 22 $\mu$m (0.9 mils). A disc with a diameter of 47 mm was cut from the sample. The disc was placed in a filter support over a flask connected to a vacuum pump. Time was measured for 100 ml of water to flow through the sample.

Water Soak

A drop of tap water was placed on the surface of the treated porous sample. If the treatment did not render the surface hydrophilic, the water drop beaded on the surface. If the surface was hydrophilic because the treatment was just on the surface, the water drop spread on the surface of the sample without soaking into the pores. In treatments caused the surface energy within the pores to change, the water drop not only spread on the surface but also soaked through the pores to the other side of the membrane.

Water Absorption

Total Absorption—A sample of known size was weighed and then soaked in tepid water. The sample was removed from the water and placed on a weighing pan in one quick motion. Total absorption was recorded as (wet weight—dry weight)/size in square meters.

60 Second Absorption—A sample of known size was weighed and then soaked in tepid water. The sample was removed from the water with tweezers and hung by a corner using a spring clamp. After 60 seconds the sample was transferred to a weighing pan. 60 Second Absorption was recorded as (weight after 60 second drip-dry weight)/size in square meters.

Gurley Air Flow

This value was a measurement of time in seconds required to pass 50 cc of air through a film according to ASTM D-726 Method B. A value of greater than 10,000 sec/50 cc was assigned if no air flow was observed for 100 seconds from the start of the test.

InfraRed Spectroscopy (IR)

Surface functional groups were determined by using a Model MB-102 FTIR available from Bomem, Quebec, Canada.

Scanning Electron Microscopy (SEM)

Surface appearance of a treated sample was analyzed by Scanning Electron Microscopy at 50,000× magnification with a Model S-4500 Scanning Electron Microscope available from Hitachi, Japan.

Secondary Ion Mass Spectrometry (SIMS)

Presence of plasma treatment within the depth of a porous sample was measured by Secondary Ion Mass Spectroscopy using a quadrupole SIMS available from Physical Electronics, Minneapolis, Minn., to obtain a depth profile of the sample. Analysis was done using a 5 keV Cs+ primary ion beam, with a current of 450 nA, rastered over an area of 800×800 $\mu$m. The aperture for collecting the ion was set at 10%. Charge compensation was obtained using a 400 eV electron gun rastered over an area of 500×500 $\mu$m.

Plasma Reactor

A commercial parallel-plate capacitively coupled plasma reactor (commercially available as Model 2480 from PlasmaTherm of St. Petersburg, Fla.), typically used for reactive ion etching, was used to carry out plasma treatments of porous samples. The reactor had a chamber that was cylindrical in shape with an internal diameter of 762 mm (30 inches) and height of 150 mm (6 inches) and a circular powered electrode having a diameter of 686 mm (27 inches) mounted inside the chamber. The powered electrode was attached to a matching network and a 3 kW RF power supply that was operated at a frequency of 13.56 MHz. The chamber was vacuum pumped with a Roots blower backed by a mechanical pump. Unless otherwise stated, the base pressure in the chamber was 0.67 Pa (5 mTorr). Process gases were metered into the chamber either through mass flow controllers or a needle valve. Unless otherwise stated, all the plasma treatments were done with the sample located on the powered electrode of the plasma reactor.

Example 1 and Comparative Examples 1–2

This example illustrates the effect of a water wetting treatment on a porous film.

A porous article (microporous polyethylene membrane made according to U.S. Pat. No. 4,539,256 Ex 8 except the film was stretched 6 times in one direction, with a pore size of about 0.09 micrometer) was treated in the Plasma Reactor with plasma containing silicon, carbon, hydrogen and oxygen.

Squares of membrane of about 12.7 cm×12.7 cm and about 22 $\mu$m (0.9 mils) thick were mounted on the powered electrode of Reactor One. The reactor chamber was pumped down to a base pressure of less than 1.3 Pa (10 mTorr). Then tetramethylsilane (TMS, available as a liquid from Aldrich Chemical Company, Milwaukee, Wis.) was introduced into the chamber at a flow rate of 25 standard cubic centimeters per minute (sccm). When the TMS flow was established, oxygen ($O_2$, available in gas cylinders from Oxygen Service Company, Minneapolis, Minn.) was metered into the chamber at a flow rate of 500 sccm. The total chamber pressure was 23.9 Pa (180 mTorr). Then, a plasma was ignited with radio frequency (RF) power of 450 watts. An ion sheath formed around the powered electrode, extended approximately 10–15 mm outward and thus encompassed the porous article. Plasma treatment was continued for two minutes. After extinguishing the plasma, the gas flows were stopped, the chamber pressure brought down to below 10 mTorr, after which the chamber was vented to atmosphere. The sample was flipped over and the treatment was repeated on the other side.

Comparative Example 1 was made in a manner similar to Example 1 except the membrane was suspended outside the ion sheath. The membrane was placed about 25 mm (1 in.) above the powered electrode and outside the ion sheath on a plastic frame that sat on top of the powered electrode. The suspended membrane treated this way was catastrophically damaged due to the heat from the plasma that existed on each side of the membrane.

Comparative Example 2 was made in a manner similar to Example 1 except the reactor was different and treatment occurred outside an ion sheath. The reactor was a PS 0524 Plasma Coating Treatment System obtained from Himont Plasma Science, now known as $4^{th}$ State, Belmont, Calif. During the plasma treatment the oxygen flow rate was 210 sccm, the TMS flowrate was 18 sccm, the chamber pressure was 35.3 Pa (265 mTorr), and the power was 500 W. The membrane was threaded midway between a powered electrode and a grounded electrode that were separated by a distance of about 86 mm (3⅜ in). Thus the membrane was over 40 mm from each electrode and well outside any ion sheath. The web moved at a rate of 3 meters/minute (10 feet/min.), resulting in a treatment time of 20 seconds.

During the post oxygen plasma treatment of CE2, the oxygen flow rate was 210 sccm, the chamber pressure was 35 Pa (260 mTorr), and the power was 500 W. The web moved at a rate of 3 meters/minute (10 feet/min.), resulting in a treatment time of 20 seconds.

Example 1 and Comparative Examples 1 and 2 were tested for water soak. Example 1 exhibited good water wettability characteristics of water soaking through the membrane. It also had no visible thermal damage from the plasma treatment. In contrast, Comparative Examples 1 and 2 exhibited no soaking of water through the membrane.

Example 2

This example illustrates the effect of a water-wetting treatment on a second type of porous article.

Example 2 was made as Example 1 except the porous article was a polypropylene blown microfiber non-woven web with a basis weight of 40 grams/sq meter, a thickness of about 150 μm (6 mils) and an effective pore diameter of about 3.3 microns.

Example 2 exhibited good water wettability without any observed thermal damage. A drop of water readily soaked all the way through the article without leaving any traces of unabsorbed water on its surface.

Example 3

This example illustrates the effect of a three-step water-wetting treatment on the type of porous article described in Example 2.

A porous article (polypropylene non-woven membrane) was treated in the Plasma Reactor with three plasmas in series, (1) $O_2$ plasma, (2) $TMS/O_2$ plasma and (3) $O_2$ plasma. The membrane was exposed to each of the three plasmas while it was within an ion sheath proximate the powered electrode. Squares of membrane of about 12.7 cm×12.7 cm were mounted on the powered electrode of the Plasma Reactor. The reaction chamber was pumped down to a base pressure of less than 1.3 Pa (10 mTorr). Next, $O_2$ gas was metered into the chamber at a flow rate of 120 sccm until a chamber pressure of 4.9 Pa (37 mTorr) was reached. Then the first plasma was ignited and sustained at a power of 500 watts for 1 minute. This plasma treatment was to prime the membrane. After the priming step, a $TMS/O_2$ mixture was metered into the chamber with the flow rates of TMS and oxygen maintained at 24.3 sccm and 500 sccm, respectively. The total pressure in the chamber was 20.0 Pa (150 mTorr). The second plasma was sustained with this mixture at a power of 500 watts for five minutes. This was followed by treatment in a third plasma formed from oxygen metered in at 170 sccm. The chamber pressure was 50 mTorr and plasma power was maintained at 500 watts for two minutes. The sample was flipped over and the three-step treatment was repeated on the other side.

The three-step treatment produced a non-woven polypropylene membrane with excellent water soak. A drop of water placed on the treated nonwoven membrane readily soaked all the way through the membrane without leaving any traces of unabsorbed water on its surface. The treatment also produced a coating that had a "water-clear" transparency.

Examples 4–5

These examples illustrate the effect of a three-step water-wetting treatment on three other types of porous film.

Examples 4–5 were made as Example 3 except the porous samples were different and the process conditions were changed as shown in Table 1. The porous sample for Example 4 was a solid cylindrical high-density polyethylene frit having a pore size of 25 microns, a diameter of 3.1 mm (0.125 in) and a length of 9.5 mm (0.375 in), available from Porex Corporation, Fairburn, Ga. The porous sample for Example 5 was a cellulose sponge with a thickness of about 25 mm (3M Grade 21 commercial grade sponge, available from 3M Company).

TABLE 1

| Condition | Example 4 | Example 5 |
| --- | --- | --- |
| $1^{st}$ Plasma: $O_2$ Flow rate sccm | 480 | 500 |
| $1^{st}$ Plasma: Pressure, Pa (mTorr) | 19.2 (144) | 20.0 (150) |
| $1^{st}$ Plasma: Power, W | 250 | 250 |
| $1^{st}$ Plasma: Time, sec. | 60 | 80 |
| $2^{nd}$ Plasma: TMS Flow rate, sccm | 22 | 32 |
| $2^{nd}$ Plasma: $O_2$ Flow rate sccm | 500 | 500 |
| $2^{nd}$ Plasma: Pressure, Pa (mTorr) | 20.0 (150) | 20.0 (150) |
| $2^{nd}$ Plasma: Power, W | 280 | 250 |
| $2^{nd}$ Plasma: Time, sec. | 60 | 60 |
| $3^{rd}$ Plasma: $O_2$ Flow rate sccm | 480 | 500 |
| $3^{rd}$ Plasma: Pressure, Pa (mTorr) | 18.9 (142) | 20.2 (152) |
| $3^{rd}$ Plasma: Power, W | 280 | 250 |
| $3^{rd}$ Plasma: Time, sec. | 60 | 60 |

Example 4 was completely wettable and it soaked up water completely. To assess the depth of the treatment, a solution of methylene blue in water was used to soak into the frit and the frit was cut with a sharp blade to assess the absorption as a function of depth. Surprisingly, the solution soaked into the pores completely throughout its depth with no noticeable gradient in blue color. This demonstrates the excellent treatment obtained in the pores through the entire depth of the article. In contrast, little if any blue color was noticed within the pores of an untreated sample of the frit used in Example 4.

The treated sponge of Example 5 soaked up significantly more water than an untreated sample of the same type of sponge. This again indicates the extent of treatment within the pores.

Example 6 and Comparative Example 2

This example illustrates the effect of a water-wetting treatment on another type of porous film.

Example 6 was made using the same type of article as Example 1 and in a manner similar to Example 1 except the composition of the plasma was varied for each of nine samples and process conditions were different. Each sample was made with RF power of 300 W and a total chamber pressure of 20 Pa (150 mTorr). Sample A was treated with the three-step plasma treatment of Example 3 except the plasma exposure times for each step were 10, 30, and 10 seconds, respectively. Sample B was treated with a single-step 30 second plasma formed from silane ($SiH_4$) gas available as a 2% concentration in argon from Praxair Specialty Gases, Kingham, Ariz., and oxygen at the flow rates shown in Table 3. Sample C to Sample I were treated with single-step 30 second plasmas formed from gas compositions having progressively decreasing ratios of TMS to $O_2$ as shown in Table 3.

Comparative Example 2 was an untreated porous sample of the same material used in Example 6.

Each sample was measured for the composition of the surface layer, i.e., for Examples 6A-6I, the layer deposited by the plasma treatment. The results are shown in Table 3.

TABLE 3

| Sample | Treatment | TMS or SiH$_4$ sccm | O$_2$ sccm | Surface Chemical Composition C % | O % | Si % | O/Si |
|---|---|---|---|---|---|---|---|
| 6A | 3-step* | * | * | 19 | 53 | 27 | 1.96 |
| 6B | SiH$_4$ | 500** | 500 | 79 | 18 | 2.4 | 7.5 |
| 6C | TMS/O$_2$ | 50 | 500 | 22 | 50 | 28 | 1.78 |
| 6D | TMS/O$_2$ | 50 | 400 | 24 | 48 | 28 | 1.71 |
| 6E | TMS/O$_2$ | 50 | 300 | 25 | 47 | 28 | 1.68 |
| 6F | TMS/O$_2$ | 50 | 200 | 29 | 43 | 28 | 1.53 |
| 6G | TMS/O$_2$ | 50 | 100 | 35 | 38 | 27 | 1.41 |
| 6H | TMS/O$_2$ | 50 | 50 | 40 | 33 | 27 | 1.22 |
| 6I | TMS/O$_2$ | 50 | 0 | 63 | 14 | 23 | 0.61 |
| CE2 | none | — | — | 100*** | — | — | — |

*Three-step treatment was same as used for Example 3 except the exposure times for the three steps were 10, 30 and 10 seconds, respectively.
**TMS was replaced with silane, SiH$_4$ gas.
***No treatment was present so only the carbon of the untreated film was detected.

The water flow tests performed on Sample 6A, having an oxygen to silicon ratio of 1.96, showed good water flow with 100 ml water flowing through the membrane in 4 minutes. Sample 6I, having an oxygen to silicon ratio of 0.61 showed no flow through the membrane. This data indicates the hydrophobic nature of the treatment.

Example 7

This example illustrates the effect of exposure time and power level.

Example 7 was made in a manner similar to Example 1 except the sample was different, process conditions were changed, and a mask was used. The porous sample was a microporous polyethylene membrane made in a manner similar to U.S. Pat. No. 4,539,256, Example 7 except the film was stretched six times in one direction. The average pore size was about 0.09 micrometers. The porous sample was exposed to a plasma treatment similar to the three-step treatment of Example 3 except process conditions and exposure times were different. The process conditions and exposure times are shown in Table 4.

TABLE 4

| Condition | 7A | 7B | 7C |
|---|---|---|---|
| 1$^{st}$ Plasma: O$_2$ Flow rate · sccm | 500 | 500 | 500 |
| 1$^{st}$ Plasma: Pressure, Pa (mTorr) | 20 (150) | 20 (150) | 20 (150) |
| 1$^{st}$ Plasma: Power, W | 300 | 300 | 100 |
| 1$^{st}$ Plasma: Time, sec. | 10 | 10 | 10 |
| 2$^{nd}$ Plasma: TMS Flowrate, Pa (mTorr) | 21.2 (160) | 21.2 (160) | 21.2 (160) |
| 2$^{nd}$ Plasma: O$_2$ Flow rate · sccm | 500 | 500 | 500 |
| 2$^{nd}$ Plasma: Pressure, Pa (mTorr) | 20 (150) | 20 (150) | 20 (150) |
| 2$^{nd}$ Plasma: Power, W | 300 | 300 | 100 |
| 2$^{nd}$ Plasma: Time, sec. | 10 | 30 | 30 |
| 3$^{rd}$ Plasma: O$_2$ Flow rate · sccm | 500 | 500 | 500 |
| 3$^{rd}$ Plasma: Pressure, Pa (mTorr) | 20 (150) | 20 (150) | 20 (150) |
| 3$^{rd}$ Plasma: Power, W | 300 | 300 | 100 |
| 3$^{rd}$ Plasma: Time, sec. | 10 | 10 | 10 |

Comparative Example 3, an untreated porous sample, made of the same material used for Example 7, and Sample 7B were measured with Gurley Air Flow, Contact Angle, Water Flow, Infra Red (IR), and Scanning Electron Microscopy (SEM) techniques. The results are shown in Table 5 or described following the Table.

TABLE 5

| Example | Gurley Air Flow g/50 cc | Contact Angle degrees | Water Flow min/100 mL |
|---|---|---|---|
| CE3 | 61 | 110 | None |
| 7B | 57 | 8 | 4 |

As seen in Table 5, the treatment caused the contact angle of distilled water to decrease and the water flow to increase. In contrast, water did not even soak into Comparative Example 3. The inventors further found that the plasma treatment within the pores of Sample 7B was not removed even when the water flow test was repeated several times in the same region of the sample.

Figure 3A:
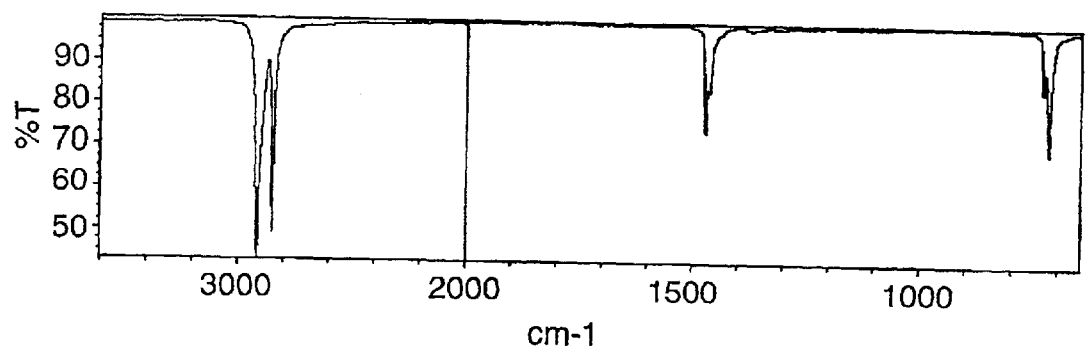
FIG. 3 shows infrared spectra of (a) untreated porous Sample CE3, (b) Sample 7-B and (c) Sample 7-B after it was washed with water.
Figure 3B:
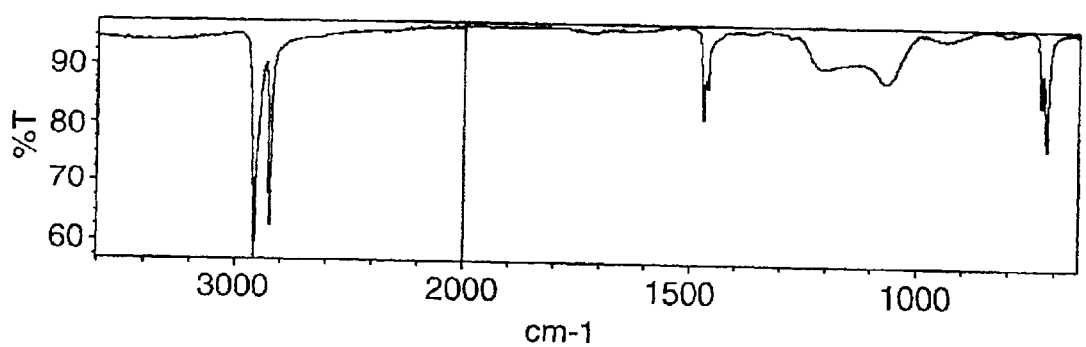
Figure 3C:
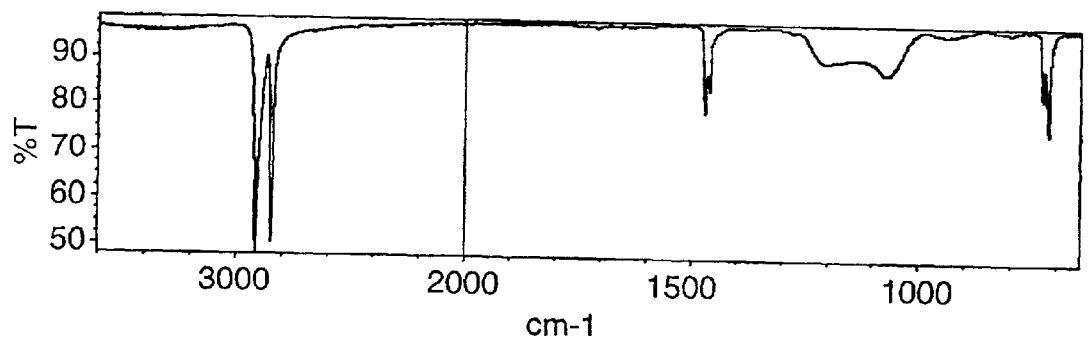

FIG. 3 illustrates the IR spectra of (a) untreated sample CE3, (b) Sample 7-B and (c) Sample 7-B after it was washed with water. The IR spectra for (b) and (c) had additional IR bands that were not detected for (a). The bands indicated the presence of Si—OH and unoxidized silanes.

Figure 4A:
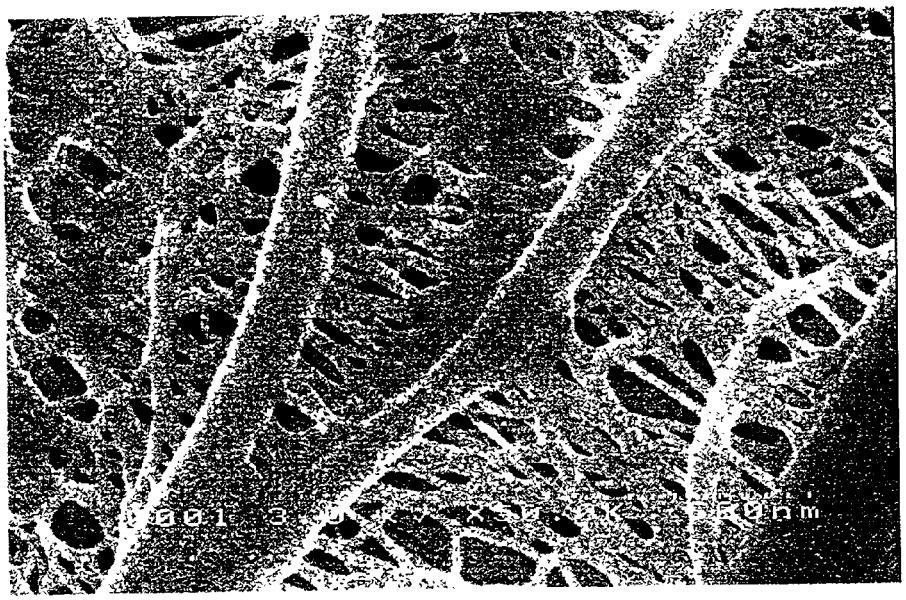
FIG. 4 is a digital image of scanning electron microscopic (SEM) pictures of (a) Example CE3 and (b) Example 7B.
Figure 4B:
Figure 5:
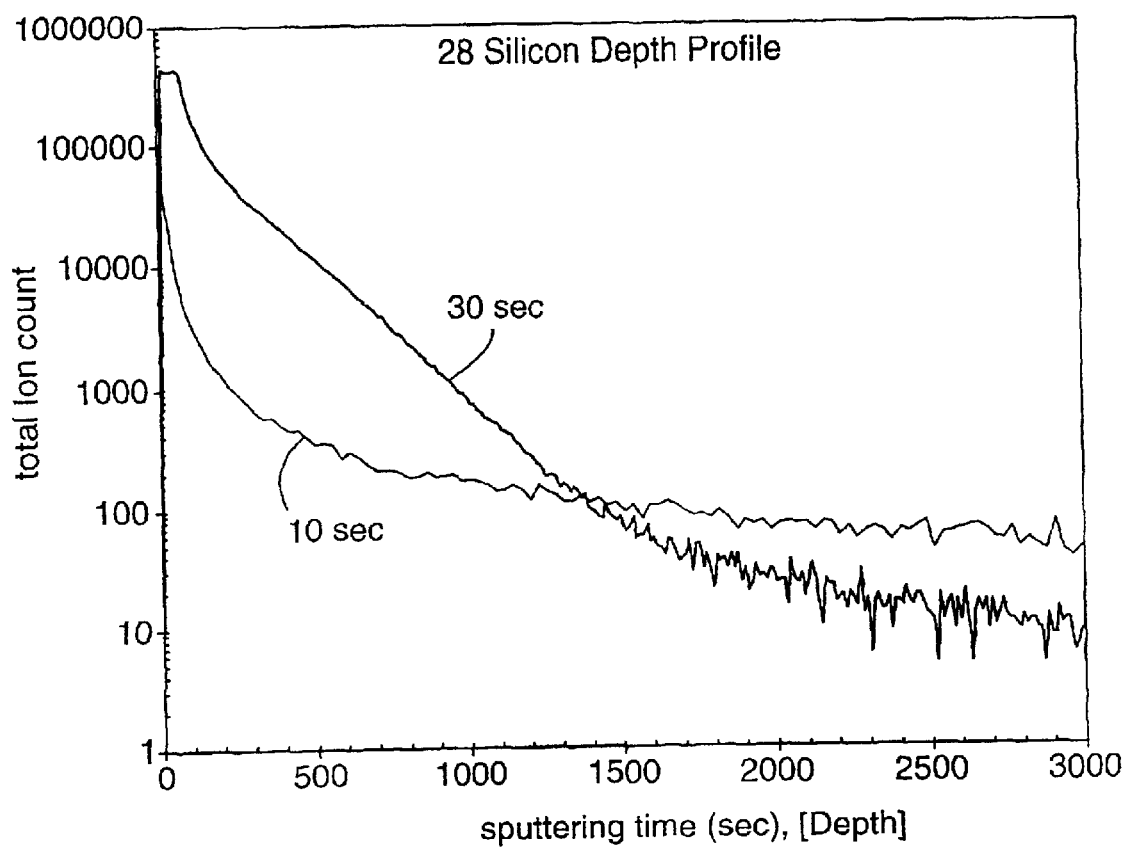
FIG. 5 is a digital image of the depth profile obtained by secondary ion mass spectrometry analysis (SIMS) for Sample 7-A (10 seconds exposure time of $2^{nd}$ plasma) and Sample 7-B (30 seconds exposure time of $2^{nd}$ plasma), respectively.

FIG. 4 shows SEM pictures of (a) untreated porous sample CE3 and (b) Sample 7B. The deposited coating in FIG. 4(b) can be clearly seen. FIG. 5 illustrates the depth profile obtained by SIMS (secondary ion mass spectrometry) analysis for Sample 7-A (10 seconds exposure time of 2$^{nd}$ plasma) and Sample 7-B (30 seconds exposure time of 2$^{nd}$ plasma), respectively. The figure illustrates the depth profile of silicon content in the pores by comparing silicon concentration to sputtering time. A sputtering time of 500 seconds corresponds to a thickness of about 0.24 microns. Because the membrane was 0.9 mil (22.5 microns) thick, as can be seen, the silicon is found through the entire depth of the membrane in Sample 7-B (30 sec TMS/O$_2$). In contrast, the silicon is not found through the entire depth of Sample 7-A (10 sec TMS/O$_2$).

Example 8

This example illustrates the use of a mask to plasma treat pre-selected regions of a porous sample.

Example 8 was made as Example 1 except masks were used and the plasma treatment was the three-step method similar to Example 3 except different exposure times were used. The porous sample was a microporous polyethylene membrane made in a manner similar to U.S. Pat. No. 4,539,256 Ex 8 except the film was stretched six times in one direction. Sample A was made with a mask that had an area of 76×102 mm (3×4 in) and 96 circular holes, each with a diameter of about 7.5 mm. The mask was placed on the porous sample while the sample was on the powered electrode. The plasma conditions are shown in Table 6. When the sample was turned over for another plasma treatment, the mask was repositioned on the surface of the sample opposite the surface of the powered electrode.

Sample B was made as Sample A except the mask had 384 holes with diameters of about 2 mm within the same area (76×102 mm).

TABLE 6

| Condition | 8A | 8B |
|---|---|---|
| Mask holes diameter | 75 mm | 2 mm |
| 1$^{st}$ Plasma: O$_2$ Flow rate, sccm | 500 | 500 |
| 1$^{st}$ Plasma: Pressure, Pa (mTorr) | 20 (150) | 20 (150) |
| 1$^{st}$ Plasma: Power, W | 300 | 300 |

TABLE 6-continued

| Condition | 8A | 8B |
|---|---|---|
| 1st Plasma: Time, sec. | 10 | 10 |
| 2nd Plasma: TMS Flowrate, Pa (mTorr) | 21.2 (160) | 21.2 (160) |
| 2nd Plasma: O$_2$ Flow rate, sccm | 500 | 500 |
| 2nd Plasma: Pressure, Pa (mTorr) | 20 (150) | 20 (150) |
| 2nd Plasma: Power, W | 300 | 300 |
| 2nd Plasma: Time, sec. | 30 | 30 |
| 3rd Plasma: O$_2$ Flow rate, sccm | 500 | 500 |
| 3rd Plasma: Pressure, Pa (mTorr) | 20 (150) | 20 (150) |
| 3rd Plasma: Power, W | 300 | 300 |
| 3rd Plasma: Time, sec. | 10 | 10 |

The masks were removed from each sample and the samples were evaluated for water wettability. Only the circles treated with plasma were hydrophilic. The rest of the film did not wet with water.

The samples were placed in water containing a water-soluble dye for 30 seconds. FIG. 6 is a picture of treated porous samples (a) Sample 8A and (b) Sample 8B, stained with the dye.

What is claimed is:

1. A method of modifying the hydrophilicity of a porous article, said method comprising:
   providing a reaction chamber having a capacitively-coupled system comprising at least one grounded electrode and at east one electrode powered by an RF source;
   generating a plasma in the chamber thereby causing an ion sheath to form around at least one of the electrodes;
   locating a porous article in the ion sheath wherein the article pores are smaller than the mean free path of any species in the plasma; and
   treating the article by allowing reactive species from the plasma to react with the article surface and pore interiors
   whereby the hydrophilicity of the article is increased such that the bulk wetting properties of the article are improved.

2. The method of claim 1 wherein treatment of the porous article is continuous.

3. The method of claim 1 wherein the plasma comprises silicon.

4. The method of claim 1 wherein the porous article is within the ion sheath formed around the powered electrode.

5. The method of claim 1 wherein a shadow mask is placed between the porous article and the plasma during treatment in order to produce an article having a patterned treated area.

6. The method of claim 1 wherein a shadow mask is placed between the porous article and the plasma during treatment in order to produce an article having a hydrophilicity gradient.

7. The method of claim 1 wherein the partial pressures of the species in the plasma are controlled to provide the desired elemental composition for the resulting article.

8. The method of claim 1 wherein the powered electrode is a rotating drum.

9. The method of claim 8 further comprising a second rotating drum powered electrode.

10. The method of claim 1 wherein the article has two parallel major surfaces and is treated on one major surface.

11. The method of claim 10 wherein the article is also treated on its second major surface.

12. The method of claim 1 wherein the treatment comprises attaching to the article surface and pore interiors by covalently bonding two or more species selected from the group consisting of oxygen, nitrogen, silicon, carbon, hydrogen, sulfur, and combinations thereof.

13. The method of claim 12 wherein a silicon-containing film is deposited and the article is post-treated with an oxygen plasma.

14. The method of claim 13 wherein the silicon-containing film is a diamond-like glass.

* * * * *

UNITED STATES PATENT AND TRADEMARK OFFICE
CERTIFICATE OF CORRECTION

PATENT NO. : 6,878,419 B2
DATED : April 12, 2005
INVENTOR(S) : David, Moses M.

It is certified that error appears in the above-identified patent and that said Letters Patent is hereby corrected as shown below:

Title page,
Item [56], References Cited, U.S. PATENT DOCUMENTS, delete "D'Angostino et al." and insert -- D'Agostino et al. --, therefor; delete ", to (n 10d) nok corp." and insert -- to (N10D) NOK corp. --, therefor.
OTHER PUBLICATIONS, "Tran et al." reference, after "vol. 132," insert -- No. 2, --.

Column 10,
Line 59, delete "($3^3/_8$ in)" and insert -- (3 3/8 in) --, therefor.

Column 13,
Line 53, delete "Flowrate" and insert -- Flow rate --, therefor.

Column 15,
Line 6, delete "Flowrate" and insert -- Flow rate --, therefor.
Line 39, after "whereby" delete "thc" and insert -- the --, therefor.

Column 16,
Line 17, delete "thc" before "species" and insert -- the --, therefor.
Line 17, after "provide" delete "thc" and insert -- the --, therefor.
Line 26, after "wherein" delete "thc" and insert -- the --, therefor.

Signed and Sealed this

Thirtieth Day of August, 2005

JON W. DUDAS
*Director of the United States Patent and Trademark Office*